United States Patent
Hao et al.

[11] Patent Number: 6,123,775
[45] Date of Patent: Sep. 26, 2000

[54] REACTION CHAMBER COMPONENT HAVING IMPROVED TEMPERATURE UNIFORMITY

[75] Inventors: Fangli Hao, Cupertine; Rajinder Dhindsa, San Jose; Javad Pourhashemi, San Ramon, all of Calif.

[73] Assignee: Lam Research Corporation, Fremont, Calif.

[21] Appl. No.: 09/343,482

[22] Filed: Jun. 30, 1999

[51] Int. Cl.⁷ .............................. C23C 16/00; C23F 1/02
[52] U.S. Cl. ...................... 118/724; 118/723 R; 118/715; 156/345; 204/473; 204/298.09; 204/298.08
[58] Field of Search .............................. 156/345; 204/473, 204/408, 431, 280, 298.08, 298.09; 118/666, 667, 723 R, 715, 724

[56] References Cited

U.S. PATENT DOCUMENTS

| | | | |
|---|---|---|---|
| 4,209,357 | 6/1980 | Gorin et al. | 156/643 |
| 4,270,999 | 6/1981 | Hassan et al. | 204/192 E |
| 4,337,495 | 6/1982 | Carney et al. | 361/119 |
| 4,481,636 | 11/1984 | Curr et al. | 373/18 |
| 4,534,816 | 8/1985 | Chen et al. | 156/345 |
| 4,590,042 | 5/1986 | Drage | 422/186.06 |
| 4,612,077 | 9/1986 | Tracy et al. | 156/345 |
| 4,780,169 | 10/1988 | Stark et al. | 156/345 |
| 5,074,456 | 12/1991 | Degner et al. | 228/121 |
| 5,134,965 | 8/1992 | Tokuda et al. | 118/723 |
| 5,151,918 | 9/1992 | Argent et al. | 373/27 |
| 5,423,936 | 6/1995 | Tomita et al. | 156/345 |
| 5,494,713 | 2/1996 | Ootuki | 427/579 |
| 5,529,657 | 6/1996 | Ishii | 156/345 |
| 5,569,356 | 10/1996 | Lenz et al. | 156/643.1 |
| 5,593,540 | 1/1997 | Tomita et al. | 156/643.1 |
| 5,614,055 | 3/1997 | Fairbairn et al. | 156/345 |
| 5,716,485 | 2/1998 | Salimian et al. | 156/345 |
| 5,730,803 | 3/1998 | Steger et al. | 118/723 R |
| 5,746,875 | 5/1998 | Maydan et al. | 156/345 |
| 5,874,805 | 2/1999 | Kavanagh | 313/631 |
| 5,879,348 | 3/1999 | Owens et al. | 606/41 |
| 5,888,907 | 3/1999 | Tomoyasu et al. | 438/714 |

*Primary Examiner*—Richard Bueker
*Assistant Examiner*—Liza Pacheco
*Attorney, Agent, or Firm*—Burns Doane, Swecker & Mathis, L.L.P.

[57] ABSTRACT

A component useful for a plasma reaction chamber includes a heat sink such as a temperature-controlled support member and a heated member such as an electrically powered showerhead electrode. The showerhead electrode is peripherally secured to the support member to enclose a gas distribution chamber between a top surface of the electrode and a bottom surface of the support member. A heat transfer member extends between the electrode and the support member and transfers heat from an area of temperature buildup on the top surface of the showerhead electrode to the bottom surface of the support member in order to control the temperature distribution across the showerhead electrode.

21 Claims, 5 Drawing Sheets

6,123,775

REACTION CHAMBER COMPONENT HAVING IMPROVED TEMPERATURE UNIFORMITY

FIELD OF THE INVENTION

The present invention relates to reactors for processing semiconductor integrated circuit substrates and specifically to a component which controls the temperature distribution across a heated member of the reactor.

BACKGROUND OF THE INVENTION

Semiconductor processing includes deposition processes such as chemical vapor deposition (CVD) of conductive, dielectric and semiconducting materials, etching of such layers, ashing of photoresist masking layers, etc. In the case of etching, plasma etching is conventionally used to etch metal, dielectric and semiconducting materials.

Showerhead electrodes for plasma processing of semiconductor substrates are disclosed in commonly assigned U.S. Pat. Nos. 5,074,456; 5,472,565; 5,534,751; and 5,569,356. Other showerhead electrode gas distribution systems are disclosed in U.S. Pat. Nos. 4,209,357; 4,263,088; 4,270,999; 4,297,162; 4,534,816; 4,579,618; 4,590,042; 4,593,540; 4,612,077; 4,780,169; 4,854,263; 5,006,220; 5,134,965; 5,494,713; 5,529,657; 5,593,540; 5,595,627; 5,614,055; 5,716,485; 5,746,875 and 5,888,907.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

During the etching process, the showerhead electrode becomes hot. In addition, the temperature can vary considerably across the surface of the electrode. The temperature difference between the center and the edge of the showerhead electrode can be about 100° C. or higher, e.g. about 200° C. The nonuniform temperature distribution can cause uneven plasma density and/or process gas distribution which leads to nonuniform etching of the wafer. In showerhead arrangements which are edge cooled, this problem becomes greater as the size of the substrate increases since the temperature differential between the center and the edge of the showerhead electrode will become more pronounced as the diameter of the showerhead increases.

When etching large, twelve-inch (300 mm) wafers with a showerhead electrode, controlling the process gas to create a uniform plasma distribution is made more difficult. For instance, the number of openings in the baffles and showerhead electrode must be increased significantly to obtain distribution of the etching gas over a larger area. In addition, as the number of openings in the baffles increases and the number of baffles increase, the complexity and cost to manufacture such a gas distribution apparatus increase greatly. Further, because the flow rate of the process gas must be increased in proportion to the increased surface area of the wafer, achievement of uniformity with respect to processing ratio, selectivity, feature shape and size become more difficult. Moreover, the increased size of the showerhead leads to greater temperature gradients across the showerhead which can cause uneven processing of the substrate.

SUMMARY OF THE INVENTION

According to the present invention the temperature differential across a heated member such as a showerhead electrode can be substantially reduced. In the case of a showerhead electrode, a controlled temperature distribution across the electrode allows more uniform processing of a semiconductor substrate. In addition, because the maximum temperature reached by the showerhead electrode can be reduced, it is possible to increase the useful life of the electrode.

According to one embodiment of the invention, a component in a reaction chamber for processing semiconductor substrates includes a heat sink (e.g., a support member), a heated member (e.g., an electrically powered showerhead electrode), and a heat transfer member between the heat sink and the heated member. The heat transfer member provides a heat flow path from an elevated temperature region of the heated member to the heat sink.

For example, in a parallel plate plasma etch process, heat generated at the center of the showerhead electrode is transferred through the heat transfer member to the support member, resulting in a low temperature differential between the center of the electrode and the periphery of the electrode. Consequently, plasma is distributed in a controlled and/or substantially uniform manner during substrate processing.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENTS

Figure 1:
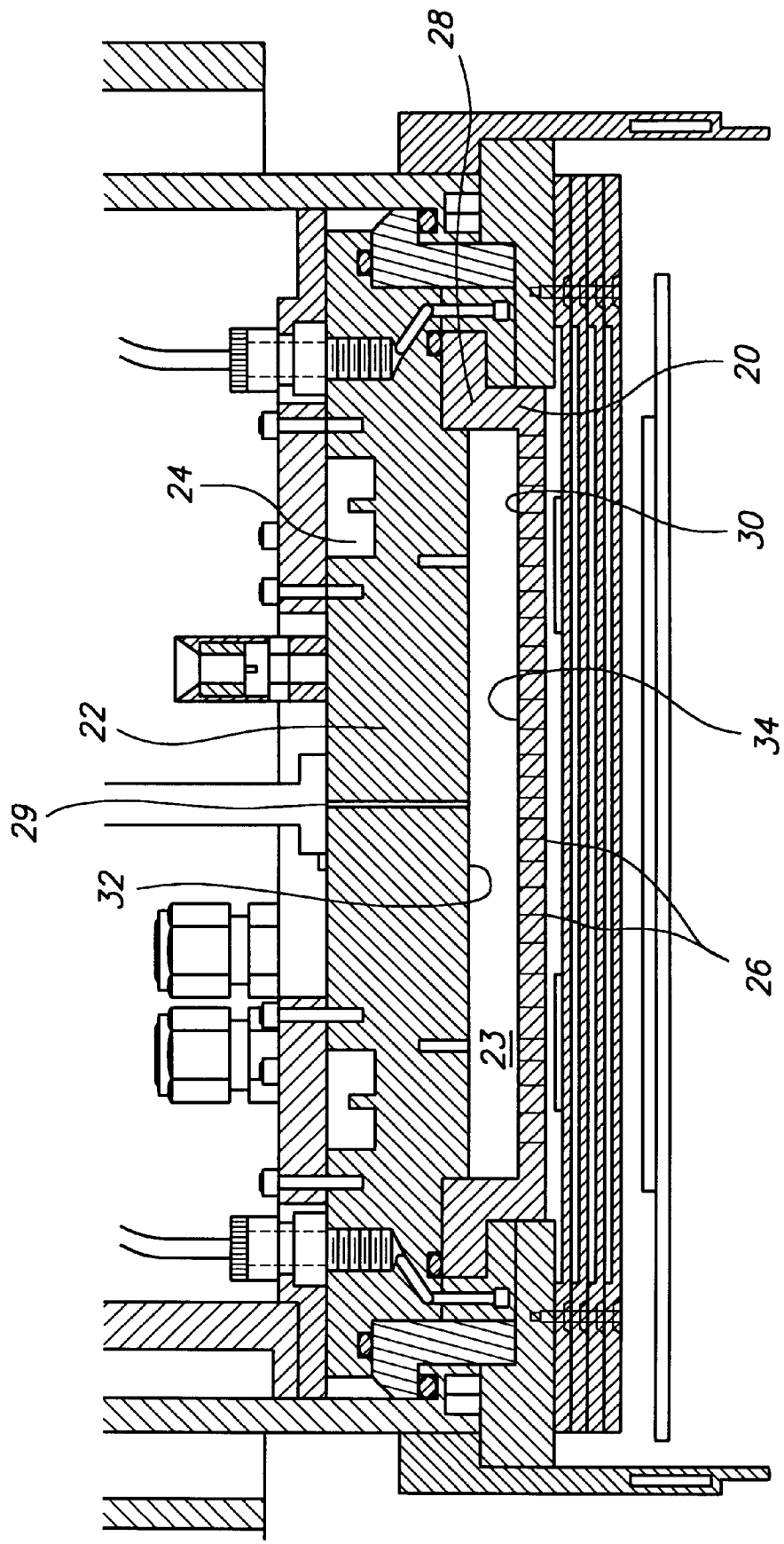
FIG. 1 is a sectional view of an example of a gas distribution system including a single gas supply.

For a better understanding of the invention, the following detailed description refers to the accompanying drawings, wherein preferred exemplary embodiments of the present invention are illustrated and described. In addition, the reference numbers used to identify like elements in the drawings are the same throughout.

The present invention provides improvements in obtaining temperature control of components of a reaction chamber for processing semiconductor substrates such as silicon wafers and flat panel displays. Such components include sputtering targets, electrically powered showerhead electrodes, showerheads, substrate supports, etc. Such components may or may not be cooled by passing coolant therethrough. The invention will now be discussed with reference to an electrically powered showerhead electrode.

During processing of a substrate in a parallel plate plasma etching chamber, a surface of a showerhead electrode increases in temperature due to, for example, resistive heating resulting from electric power being applied to the electrode. The heat generated flows to the heat sink at its periphery (where the electrode and the heat sink are secured to one another). However, because a center region of the electrode is not in direct contact with the heat sink, the temperature of the center region of the electrode can be much higher than the periphery of electrode making it difficult to satisfactorily control substrate processing. Likewise, due to heating of a showerhead, a target or substrate, the showerhead or surface below the substrate or target may become hotter in some portions than in others. The present invention provides a mechanism to improve temperature uniformity of such surfaces.

The following description discusses the present invention in the context of controlling the temperature distribution across a showerhead electrode or a substrate support in a plasma reaction chamber. However, the principles of the invention can be used to control the temperature distribution across other heated members of a reaction chamber for semiconductor processing.

An exemplary reaction chamber component for a plasma etching process is shown in FIG. 1 wherein a showerhead electrode 20 is secured to a cooled support member 22 to define a gas distribution chamber 23. The temperature of the support member 22 can be controlled by circulating coolant through cooling channels 24 in the support member 22.

Figure 3:
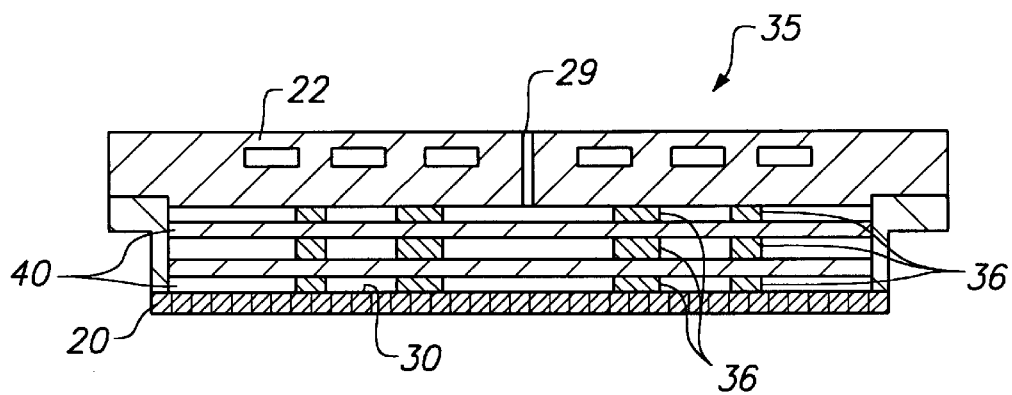
FIG. 3 is a sectional view of a second embodiment of the present invention.

The showerhead electrode 20 is preferably of silicon but can be of any other suitable electrically conductive material such as aluminum, graphite, silicon carbide, etc. and gas passes through a plurality of openings 26. In the arrangement shown in FIG. 1, the showerhead electrode 20 has an edge portion 28 which is integral with the electrode. However, the edge portion 28 can comprise a separate support ring bonded to the outer edge of a circular showerhead plate, as shown in FIG. 3. In either case, the outer edge 28 is in thermal and electrical contact with the support member 22. The gas distribution chamber 23 is defined by a top surface 30 of the showerhead electrode 20, the edge portion 28 and a bottom surface 32 of the support member 22. Process gas is supplied to the chamber 23 by a central gas supply 29. However, the process gas can be supplied at the periphery of the electrode and/or by more than one gas supply. Gas flows downward through the gas distribution chamber and passes through the openings 26 in the showerhead electrode 20.

Electric power (typically RF power, although DC power may be used) is supplied to the showerhead electrode 20 in order to energize process gas into plasma. When electrical power is applied to the showerhead electrode 20 resistive heating occurs and the showerhead electrode 20 increases in temperature. If heat is removed from only the periphery of the electrode 20, the temperature at a center region 34 of the showerhead electrode 20 can increase more quickly than heat can be laterally transferred through the showerhead electrode 20 to the edge portion 28. As a result, a large temperature differential (e.g., about 100 to 300° C.) can develop between the center region 34 of the showerhead electrode 20 and the edge portion 28 of the showerhead electrode 20. This large temperature differential interferes with the uniform distribution of the process gas through the showerhead electrode 20 and/or the uniform distribution of power to the plasma.

Figure 2:
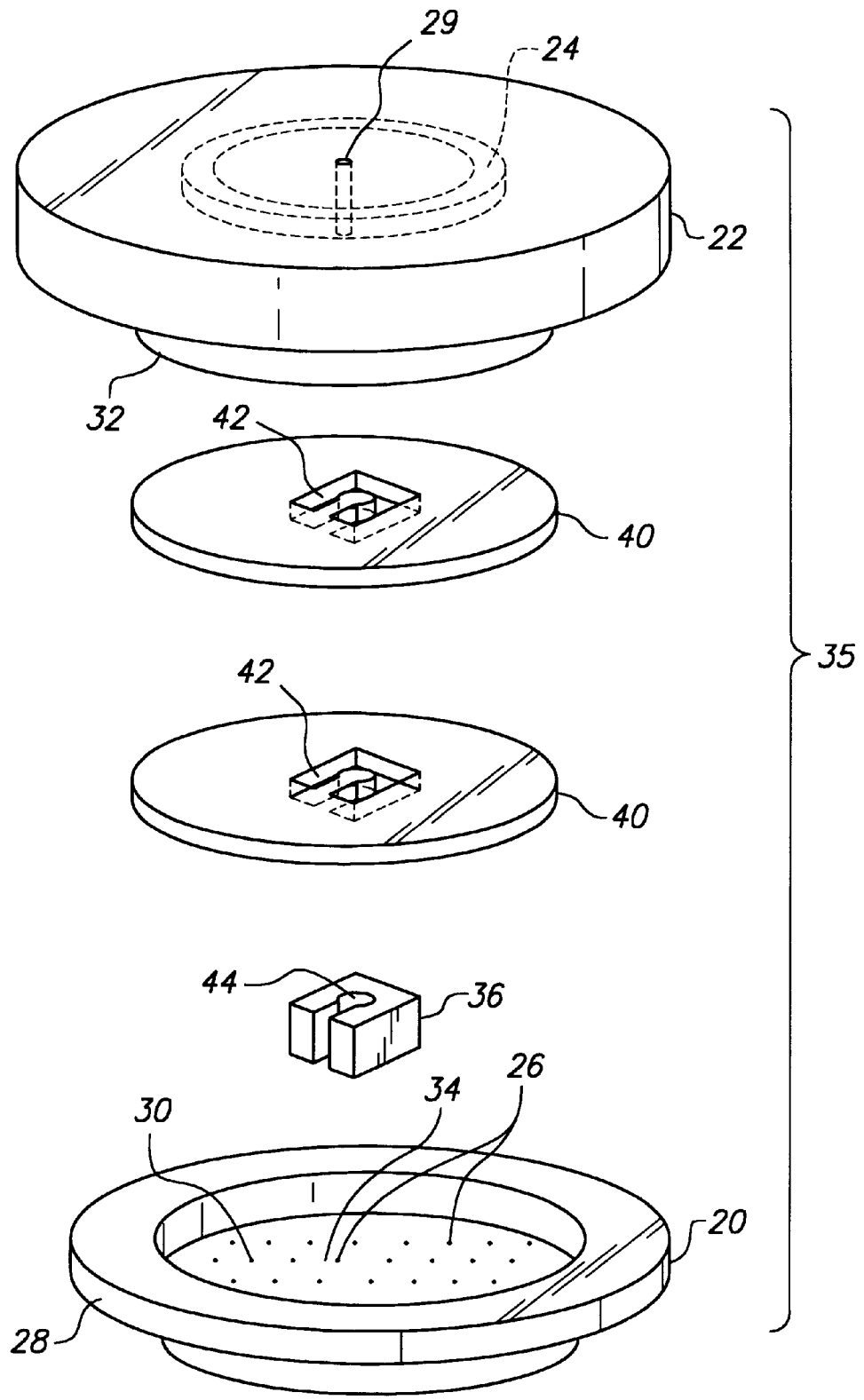
FIG. 2 is an exploded perspective view of a first embodiment of the present invention.

A first embodiment of the invention is shown in FIG. 2 wherein a component 35 according to the present invention includes one or more heat transfer members 36 between the center region 34 of the top surface 30 of the showerhead electrode 20 and a bottom surface 32 of the temperature-controlled support member 22. During plasma processing, heat is transferred through the heat transfer members 36 to the temperature-controlled support member 22. In this way, the temperature difference between the center region 34 and the edge portion 28 of the showerhead electrode 20 can be dramatically reduced (e.g., a temperature differential less than 50° C., preferably less than 15 to 20° C. between the edge and the center of an electrode can be obtained). As a result, in semiconductor processing such as single wafer plasma etching wherein a wafer is below the showerhead electrode, more uniform processing can be achieved.

Heat transfer members 36 are preferably formed of a material which is thermally and electrically conductive. However, materials which are not electrically conductive, but are still thermally conductive may also be used. Suitable materials include ceramic materials such as SiC, $Si_3N_4$, AlN, etc., metals such as Al, Cu, stainless steel, Mo, etc. and metal composites such as reinforced metals (e.g., carbon fiber-aluminum or copper, boron fiber-aluminum, SiC particle-aluminum, etc.). For example, the heat transfer members 36 can be cast aluminum bodies which machined into a desired shape.

The FIG. 2 embodiment includes a baffle assembly which acts to more uniformly distribute etching gas to the top surface 30 of the showerhead electrode 20. The baffle assembly may include one or more baffle plates 40 located between the showerhead electrode 20 and the support member 22. The baffle plates 40 can be made of aluminum and include one or more cutouts 42 to accommodate a similarly shaped heat transfer member 36 which fits into the cut-out defined space between the bottom surface 32 of the support member 22 and the top surface of the showerhead electrode.

As shown in FIG. 2, the heat transfer member 36 includes a notch 44 which allows process gas to flow from the gas supply inlet 29 into plenums defined by the baffle plates. As a result, the gas supplied by the inlet 29 can be distributed across the surfaces of the baffle plates 40.

FIG. 3 shows a second embodiment of a component 35 in accordance with the invention wherein the baffle plates 40 need not be cut to accommodate a heat transfer member 36. Instead, heat transfer members 36 are sandwiched between the support member 22, baffle plates 40 and showerhead electrode 20. The heat transfer members 36 can include gas passages therethrough to allow gas from the inlet 29 to be distributed in plenums defined by the baffle plates 40. Alternatively, the heat transfer members 36 could be solid and the baffle plates could include grooves or channels to allow the process gas to circulate freely in the plenums defined by the baffle plates.

Figure 4:
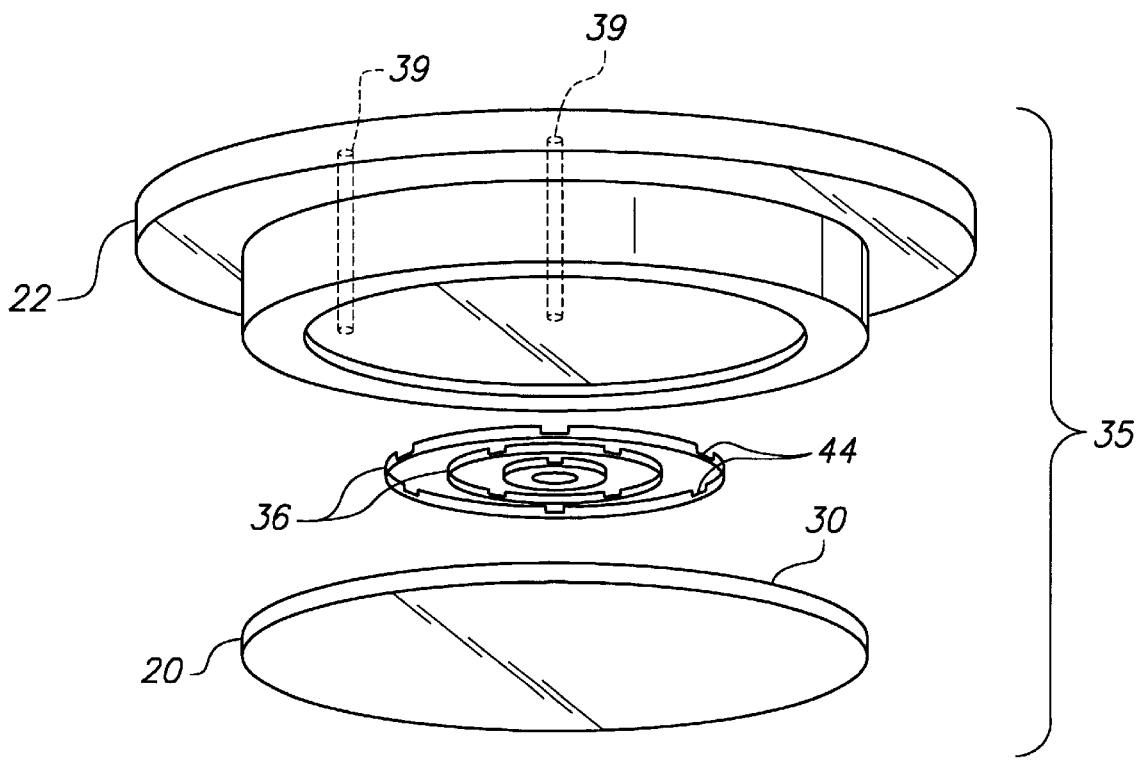
FIG. 4 is an exploded perspective view of a third embodiment of the present invention.

A third embodiment of a component 35 according to the present invention is shown in FIG. 4 wherein the reaction chamber does not include baffle plates between the support member 22 and the showerhead electrode 20. In the third embodiment, the heat transfer members 36 are located within a gas distribution chamber defined between the showerhead electrode 20 and the support member 22. As shown in FIG. 4, the heat transfer members 36 include notches 44 which allow process gas to flow between the heat transfer members 36 and across the surfaces of the support member 22 and the showerhead electrode 20.

In order to enhance removal of heat from the showerhead electrode 20, the heat transfer members 36 preferably have excellent thermal contact with both the bottom surface 32 of the support member 22 and the top surface 30 of the showerhead electrode 20. Ideally, there are no gaps between the heat transfer members 36, the heated member (e.g., the showerhead electrode 20), and the heat sink (e.g., the support member 22). Good thermal contact between these parts can be assured in various ways such as by manufacturing the showerhead electrode 20, the heat transfer members 36 and the support member 22 to provide mating surfaces, providing a thermally conductive material such as a gasket of metallic material such as indium, silver or the like on opposite sides of the heat transfer members, and/or bonding the top surface 30 of the showerhead electrode 20 with metallic material or conductive adhesive such as an elastomer containing electrically and/or thermally conductive particles.

Figure 4A:
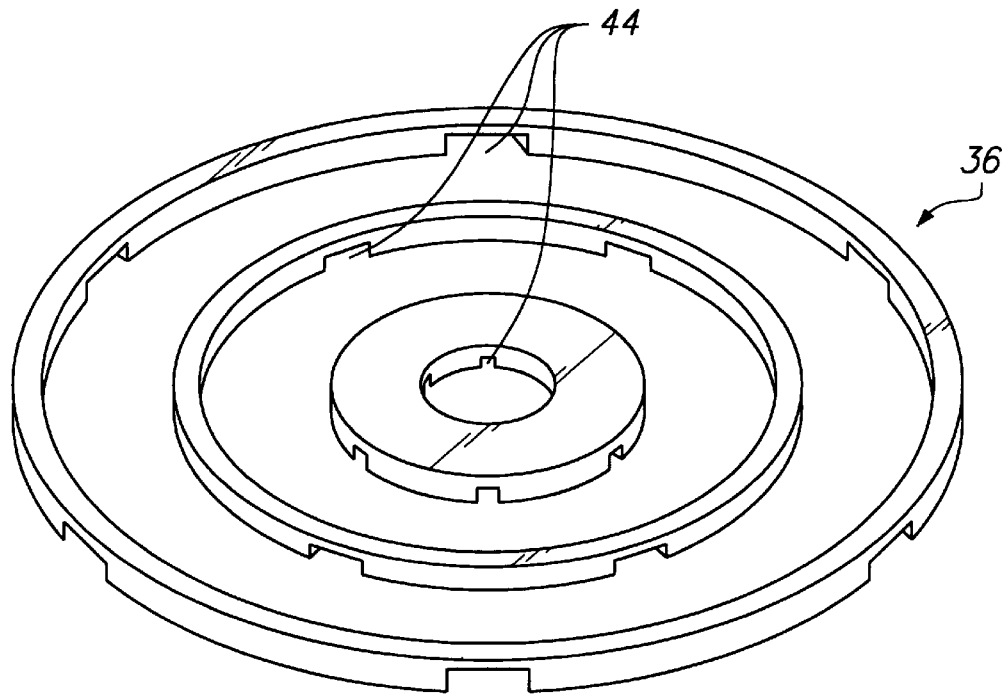
FIG. 4A is a perspective view of the heat transfer member shown in FIG. 4 wherein the heat transfer member comprises concentric rings.

As seen in more detail in FIG. 4A, the heat transfer members 36 sandwiched between the showerhead electrode 20 and the support member 22 are concentrically arranged annular rings. The rings include notches 44 therein to allow process gas to flow across the gas distribution chamber. Although three rings are shown in FIGS. 4 and 4A, the number of rings may be increased or decreased to achieve a desired heat transfer effect. Further, the heat transfer member or members can be in shapes other than rings (e.g., the heat transfer member could be in the shape of a central hub and radially extending arms or any other suitable shape). Ideally, the heat transfer members 36 are arranged to cover a minimum amount of the top surface 30 of the showerhead electrode 20 while still achieving the desired heat transfer effect.

Preferably, in order to obtain a more even distribution of gas within a gas distribution chamber not including baffle plates, the component 35 can include multiple gas supplies 39. In such an arrangement, because the gas pressure is highest at the outlet of each gas supply 39, the provision of multiple gas supplies 39 allows a more even distribution of gas pressure distribution to be obtained compared to that of a single gas supply.

Figure 5:
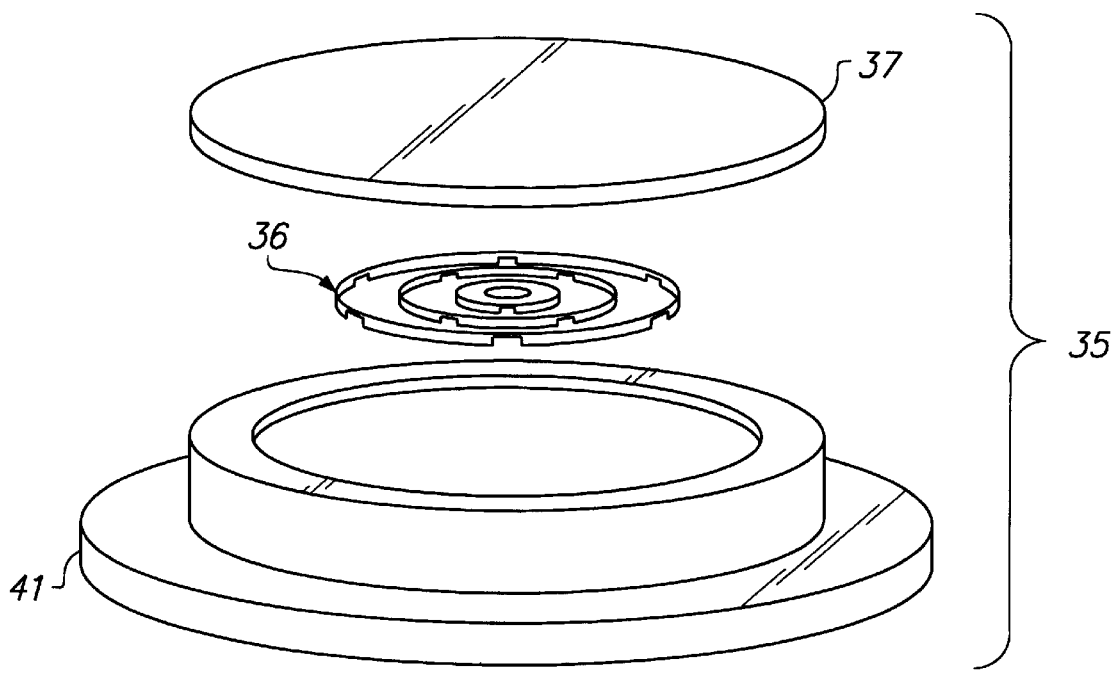
FIG. 5 is an exploded perspective view of a fourth embodiment of the present invention.

FIG. 5 shows a fourth embodiment of a component 35 according to the present invention wherein the heat transfer member 36 is located between a substrate support surface 37 and a support member 41. The surface 37 can be part of a bottom electrode which may or may not have an electrostatic clamp (ESC) associated therewith. The heat transfer member 36 can be used to draw heat away from a portion of the surface 37 to the support member 41, thereby controlling the temperature differential across the surface 37. In such a case, the substrate support can omit a He backcooling arrangement typically used for cooling substrates such as Si wafers.

Figure 6:
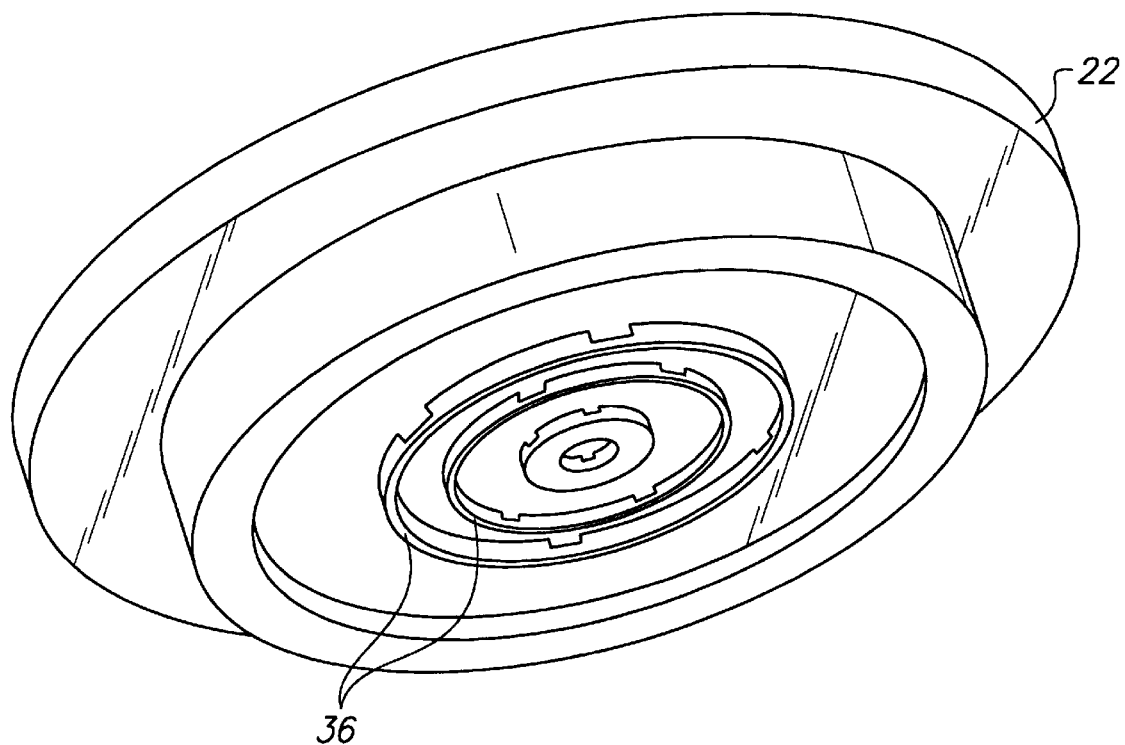
FIG. 6 is a perspective view of a heat transfer member which is integral with a support member.
Figure 7:
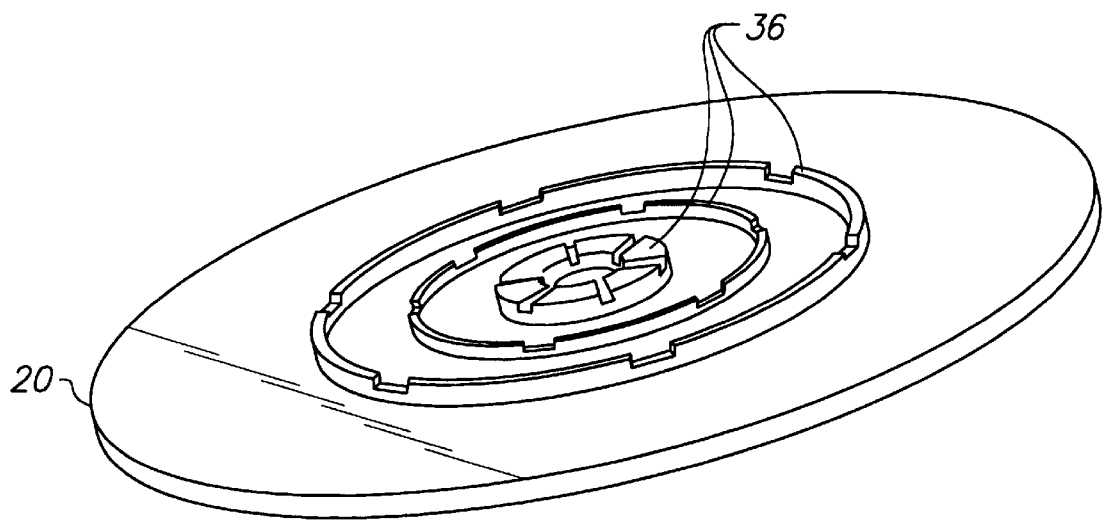
FIG. 7 is a perspective view of a heat transfer member which is integral with a showerhead electrode.

In the foregoing embodiments, the heat transfer members 36 can be separate pieces or integral with either the heated member (e.g., the showerhead electrode 20) or the heat sink (e.g., support member 22). FIG. 6 shows an example of heat transfer members 36 which are integral with the showerhead electrode and FIG. 7 shows an example of heat transfer members 36 which are integral with the support member 22. If bonding material is used, the bonding material should have good thermal and optionally electrical conductivity and be compatible in a vacuum environment (e.g., have a low vapor pressure so that the material will not significantly contaminate a semiconductor processing environment). Suitable bonding materials include conductive adhesives such as elastomers or epoxies and solder or brazing materials.

Thus, according to the present invention, in the case of a showerhead electrode arrangement, direct or indirect surface to surface contact between the center region 34 of the showerhead electrode 20 and the temperature-controlled support member 22 can be achieved. In this way, the present invention can control the temperature differential between the center region 34 and the edge portion 28 of a showerhead electrode 20. Such better temperature control across the showerhead electrode 20 can provide a more controlled plasma density and/or gas flow/pressure across the substrate being processed.

The present invention has been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way. The scope of the invention is given by the appended claims, rather than the preceding description, and all variations and equivalents which fall within the range of the claims are intended to be embraced therein.

What is claimed is:

1. A temperature controlled component useful in a reaction chamber for processing a semiconductor substrate, comprising:

a heat sink;

a heated member comprising a showerhead or sputter target support supported by the heat sink; and a heat transfer member in thermal contact with the heat sink and a localized region of the heated member at which temperature buildup is highest across the heated member.

2. A temperature controlled component useful in a reaction chamber for processing a semiconductor substrate, comprising:

a heat sink:

a heated member supported by the heat sink; and a heat transfer member in thermal contact with the heat sink and a localized region of the heated member at which temperature buildup is highest across the heated member, the heat sink being a support member having a bottom surface, and the heated member being an electrically powered showerhead electrode peripherally secured to the support member so as to enclose a gas distribution chamber between a top surface of the showerhead electrode and the bottom surface of the support member, and wherein the heat transfer member is in thermal contact with a center region of the top surface of the showerhead electrode and the bottom surface of the support member.

3. The component of claim 2, wherein process gas is supplied to the gas distribution chamber through one or more gas supplies.

4. The component of claim 2, wherein the heat transfer member comprises a unitary body of metal.

5. The component of claim 2, wherein the heat transfer member is a cast metal body.

6. The component of claim 2, wherein the heat transfer member is a shaped body of silicon.

7. The component of claim 2, wherein the heat transfer member is a metal composite body.

8. The component of claim 2, wherein the heat transfer member comprises a projection on the top surface of the electrode.

9. The component of claim 2, wherein the heat transfer member comprises a shaped body bonded to the top surface of the electrode with bonding material.

10. The component of claim 9, wherein the bonding material is a metallic material or thermally conductive adhesive.

11. The showerhead electrode assembly of claim 2, wherein the heat transfer member comprises a projection on the bottom surface of the support member.

12. The component of claim 2, wherein the heat transfer member comprises a shaped body bonded to the bottom surface of the support member with bonding material.

13. The component of claim 12, wherein the bonding material is a metallic material or thermally conductive adhesive.

14. The component of claim 2, wherein the heat transfer member comprises concentrically arranged annular rings.

15. The component of claim 14, wherein the rings include gas passages therethrough.

16. The component of claim 2, wherein a coolant passes through channels in the support member.

17. The component of claim 2, further comprising a baffle assembly located between the support member and the showerhead electrode, the baffle assembly including first and second baffle plates.

18. A component of claim 17, wherein the first and second baffle plates include shaped openings having the shape of the heat transfer member and the shaped openings are closely fitted around the heat transfer member.

19. The component of claim 17, wherein the heat transfer member comprises first, second and third shaped bodies, the first body thermally contacting the center region of the top surface of the showerhead electrode and an underside of the first baffle plate, the second body thermally contacting the top of the first baffle plate and an underside of the second baffle plate, and the third body thermally contacting the top of the second baffle plate and the bottom surface of the support member.

20. In a component for a plasma chamber wherein process gas passes through a baffle plate into a gas plenum between the baffle plate and a showerhead electrode and then through openings in the showerhead electrode into the plasma chamber, the improvement comprising a heat transfer member providing a heat flow path between a central portion of the showerhead electrode and a cooled support member above the baffle plate.

21. A method of processing a semiconductor substrate in a plasma chamber wherein process gas passes through a baffle plate into a gas plenum between the baffle plate and a showerhead electrode and then through openings in the showerhead electrode into the plasma chamber, and a heat transfer member provides a heat flow path between a central portion of the showerhead electrode and a cooled support member above the baffle plate, the method comprising flowing process gas through the showerhead electrode, energizing the process gas into a plasma state by supplying RF power to the showerhead electrode, and contacting an exposed surface of the semiconductor substrate with the plasma.

* * * * *